United States Patent [19]

Simpson

[11] 3,902,189

[45] Aug. 26, 1975

[54] PREFABRICATED ARTICLE AND METHODS OF MAINTAINING THE ORIENTATION OF PARTS BEING BONDED THERETO

[75] Inventor: Frank M. Simpson, Richardson, Tex.

[73] Assignee: Hunt Electronics, Dallas, Tex.

[22] Filed: Apr. 10, 1974

[21] Appl. No.: 459,454

[52] U.S. Cl. ................ 357/70; 29/588; 174/52 PE; 357/72

[51] Int. Cl.$^2$ ...................... B01J 17/00; H01L 1/10

[58] Field of Search .......... 174/52 S, 52 PE, DIG. 3, 174/68.5; 317/101 C, 101 CC, 101 A; 29/588–591, 193, 193.5; 357/68–70, 72

[56] References Cited

UNITED STATES PATENTS

| | | | |
|---|---|---|---|
| 3,339,008 | 8/1967 | MacArthur et al. | 174/68.5 |
| 3,379,937 | 4/1968 | Shepherd | 174/68.5 X |
| 3,404,248 | 10/1968 | Bower | 174/68.5 X |
| 3,478,420 | 11/1969 | Grimes et al. | 357/70 X |
| 3,606,673 | 9/1971 | Overman | 357/70 X |
| 3,778,887 | 12/1973 | Suzuki et al. | 29/193 X |

*Primary Examiner*—Darrell L. Clay
*Attorney, Agent, or Firm*—Giles C. Clegg, Jr.

[57] ABSTRACT

A prefabricated article, for example, a lead frame, is designed to accommodate parts, for example, semiconductor electronic devices and connecting wires therefor, which are bonded to the lead frame with a fusible material, for example, a metal alloy solder. The semiconductor device may be placed on a portion of a planar surface of the lead frame with a solder layer interposed therebetween. The planar surface of the lead frame is formed either with a single continuous groove or moat or a plurality of spaced grooves, forming a boundary around the die-receiving portion of the surface. The walls of the groove contiguous with the die-receiving surface intersect the surface at an angle sufficient to prevent the solder in a molten state from flowing across the boundary by the mechanism of the surface tension of the solder. This prevents the die from becoming disoriented during the bonding operation. Additionally, a pair of spaced terminals or legs of the lead frame are formed with angular projections on predetermined sections thereof which are adapted to receive and support the connecting wires when the wires are formed with similarly angled bends to facilitate the connection of contact pads of the semiconductor device on the supporting surface to the lead frame terminals are legs while maintaining the proper orientation of the wires with respect to the device.

2 Claims, 8 Drawing Figures

PREFABRICATED ARTICLE AND METHODS OF MAINTAINING THE ORIENTATION OF PARTS BEING BONDED THERETO

BACKGROUND OF THE INVENTION

1. Field of the Invention

The present invention relates to articles having parts bonded thereto and, more particularly, to prefabricated articles, for example, lead frames and methods of maintaining the orientation of parts bonded thereto, for example, semiconductor dice and connecting wires.

2. Technical Considerations and Prior Art

In the manufacture of solid-state electronic devices, for example, transistors and silicon-controlled rectifiers, a die or chip defining the device is bonded with fusible material to a planar supporting surface on a lead frame. Thin wires formed from a highly conductive metal, for example, silver or copper, are connected to contact pads of the chip and are bonded to conductive access leads on the lead frame. The lead frame and the device thereon are subsequently encapsulated in a thermosetting material, for example, an epoxy resin with the access terminals protruding from the encapsulated assembly. Typically, a plurality of lead frames are formed from a stamped strip of material in order that the devices may be batch fabricated.

The die is bonded to a metal tab on the lead frame formed with a planar surface for receiving the die with the fusible material, for example, lead or tin solder, interposed between the die and the surface of the tab. The die is oriented precisely on the receiving surface of the tab. The assembly is then heated to cause the solidified solder material to melt. Upon cooling, the die becomes bonded to the tab by the solder.

A severe problem which has been associated with the bonding of the dice to the tabs on the lead frames is that the molten solder can become a carrier for a die which floats thereon and can become disoriented as the solder becomes flowable, thus requiring the reorientation of the die while the lead frame is at a relatively high temperature.

One technique for overcoming the tendency of the molten solder to flow carrying the die with it, is to provide the lead frame assembly with one or more retaining lugs which may be bent over to hold the die in position against the die-receiving surface of the tab. However, the formation of these lugs is a complex operation, especially when the lead frame is formed by stamping it from a metal strip, and increases production costs substantially.

Another technique for overcoming the disorientation problem is to form a cavity in the tab for receiving the die and the solder. The cavity acts to contain the solder therein by gravity such that the solder does not flow along the surface of the tab outside of the area thereof where the die is positioned. This cavity may be formed by a milling or a stamping operation.

Since the die-receiving surface of the tab must be highly polished, free of contaminates, and as smooth and flat as possible, a milling or a stamping process can produce surface irregularities within the cavity which can affect the electrical operation of the device contained on the die, since the tab is typically used as a conductive heat sink therefor. Thus, it is desirable to provide for additional polishing or electroplating of the surfaces within the cavity to insure that they are smooth and flat. These operations are costly and difficult to perform.

It is therefore desirable and advantageous to provide a method of and means for facilitating the bonding of the die to the tab of the lead frame with a fusible material while preventing the fusible material from flowing along the surface of the tab and disorienting the die with respect thereto, which overcomes the disadvantages of prior art techniques.

Additionally, in bonding the wires to the contact pads of the device defined in the die, it is necessary precisely to locate the ends of the wires with respect to the contact pads before bonding takes place.

Thus, it is also desirable to provide the lead frame with some means for orienting or aligning the wires with the desired areas of the device.

SUMMARY OF THE INVENTION

One object of the present invention is to provide a new and improved prefabricated article for receiving a part bonded thereto.

A further object of the present invention is to provide a new and improved method of facilitating the bonding of a part to an article utilizing fusible bonding material.

A further object of the present invention is to provide a new and improved method of facilitating the bonding of a precisely oriented part to a planar surface on an article, utilizing fusible material, whereby the fusible material in a molten or flowable state is effectively prevented from flowing on the planar surface outside of the boundaries of the part-receiving portion thereof to prevent the part on the article from becoming disoriented.

A further object of the present invention is to provide a new and improved lead frame for mounting a semiconductive device, wherein the semiconductive device is precisely oriented on and bonded to a planar surface of the lead frame with solder material, whereby the molten solder is effectively prevented from flowing outside of the device-receiving boundaries on the planar surface of the frame to prevent the device from becoming disoriented.

A further object of the present invention is to provide a new and improved lead frame for mounting a semiconductive device, wherein the wires connecting the ports of the device to the lead frame may be precisely aligned with respect to the contact pads of the device and the lead frame.

A method of preventing relative movement between a part supported by a layer of fusible material on a portion of a planar surface of an article, in accordance with the principles of the present invention, may include forming in the surface, around at least discrete portions of the boundary of the part-receiving portion thereof, a discontinuity extending below the planar surface area of the article at an angle sufficient to confine the fusible material, through the mechanism of its own surface tension, within the part-receiving portion of the surface defined by the intersection of the surface and the discontinuity.

A prefabricated article for receiving a part to be bonded thereto by a fusible material, in accordance with the principles of the present invention, may include a planar surface formed on the article, the surface being formed, on at least discrete portions thereof defining a boundary thereon for receiving the part therewithin, with a discontinuity extending therebelow at an angle sufficient to confine the fusible material within the boundary by the mechanism of its own surface tension, to prevent relative movement between the part and the article when the fusible material is advanced to a molten state.

The prefabricated article may be, for example, a lead frame designed to accommodate parts, for example, semiconductor dies, which are placed on a portion of the planar surface of a tab formed on the lead frame with a fusible material, for example, a layer of solder interposed between the die and the tab. The planer surface of the tab is formed with a moat around the die receiving portion thereof to define a boundary therearound.

The moat may be a continuous groove or a plurality of spaced discrete grooves. The walls of the groove contiguous with the die-receiving surface intersect the surface at an angle sufficient to prevent the solder, when in a molten or flowable state, from flowing across the boundary because of the surface tension of the solder. This prevents the die from becoming disoriented during the bonding operation when the solder is flowable.

An improved lead frame of the type formed with a tab having a planar surface for mounting a die thereon and a pair of conductive coplanar legs spaced on opposite sides of the mounting surface of the tab for receiving lead wires to be bonded thereto and to the die, in accordance with the principles of the present invention, may include wire-receiving angular sections formed in the legs and aligned with one another on opposite sides of the tab.

The wires may be formed with angular offsets or bends conforming to the angular projections on the legs to maintain proper orientation of the wires with respect to the die. The tab may be supported in a plane spaced from the plane of the legs a distance equivalent to the thickness of the die to facilitate the bonding of the wires to the die.

BRIEF DESCRIPTION OF THE DRAWINGS

A complete understanding of the present invention will be obtained from the following detailed description thereof when read in conjunction with the accompanying drawing, wherein.

DETAILED DESCRIPTION

Figure 1:
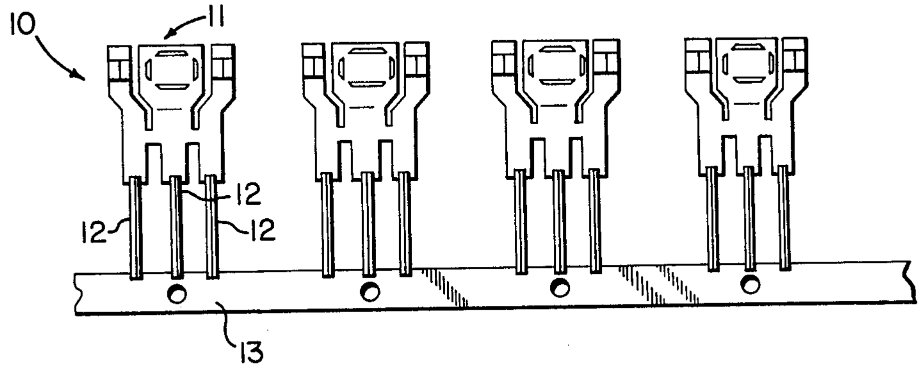
FIG. 1 is a plan view of a section of a lead frame assembly in accordance with the principles of the present invention.

Referring to FIG. 1, there is shown a prefabricated lead frame assembly 10 formed from a conductive metal, for example, copper or an alloy of copper, and modified in accordance with the principles of the present invention. The assembly 10 includes a plurality of lead frams 11, each connected by groups of three parallel leads 12 to a carrier strip 13.

Figure 2:
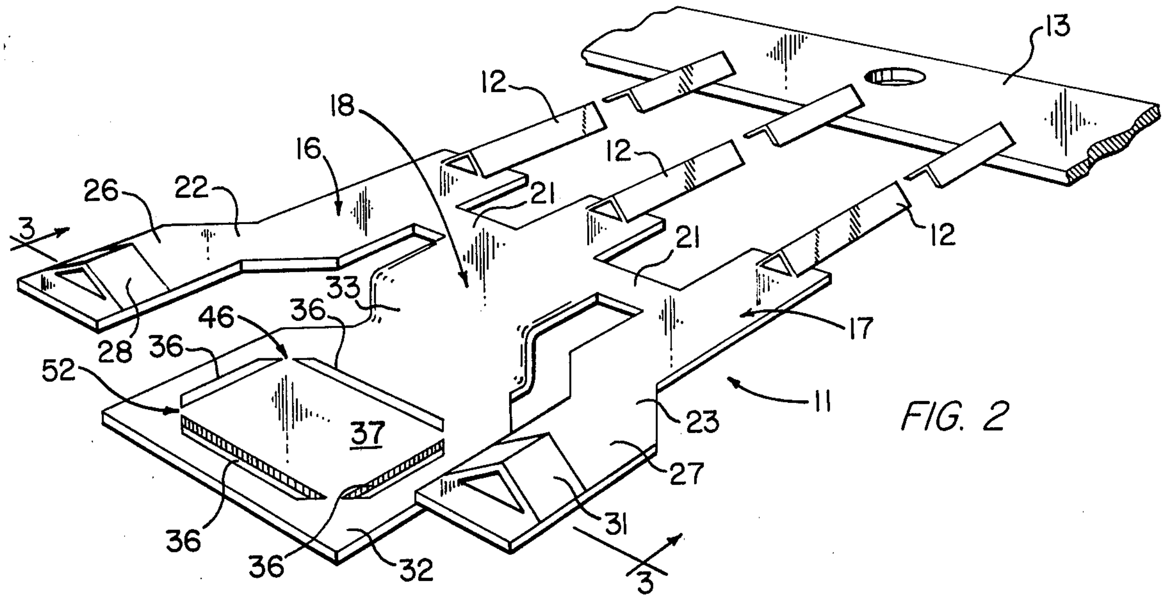
FIG. 2 is a perspective view of a lead frame construction forming part of the assembly of FIG. 1.

As best shown in FIG. 2, the outer leads 12 of each group of three thereof are formed at the ends of a pair of legs 16 and 17 disposed on both sides of a tab 18 and connected thereto through short segments 21.

Each lead 12 has a channel-type construction which is generally V-shaped in cross-section, providing resilience to the leads 12. The legs 16 and 17 include outwardly diverging portions 22 and 23, respectively, extending from which are end segments 26 and 27 formed on their upper surfaces with stamped angular projections 28 and 31, respectively.

The distal end of the tab 18 is formed with an enlarged planar support 32 extending from an intermediate Z-shaped portion 33. The supporting surface of the support 32 is formed with a plurality of notches or grooves 36 which define the boundaries of the die-supporting portion 37 of the surface of the support 32.

Figure 3:
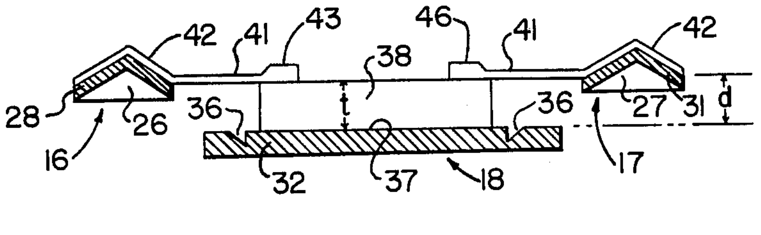
FIG. 3 is a sectional view of the lead frame taken along the lines 3—3 of FIG. 2.

As shown in FIG. 3, the distance *d* between the flat surfaces of the legs 16 and 17 and the die-supporting surface 37 of the support 32 is selected to be substantially the same as the thickest portion *t* of a die 38, typically 25 to 100 mils to be bonded to the surface 37.

The die 38 may be bonded to the surface 37 by a fusible material for example, lead solder, which, alternatively, may be precoated on the undersurface of the die 38 or coated on the surface 37 or in the form of a preform positioned thereon.

This permits a pair of connecting lead wires 41, which are bent at 42 to conform to the angled edges of the projections 28 and 31, to be positioned and oriented precisely on the lead frame 11 for subsequent bonding operations to connect a pair of contact pads 43 and 46 of the die 38 to the legs 16 and 17 at the projections 28 and 31 thereof.

Typically, the lead frame assembly 10 with the dies 38 positioned thereon and the fusible layer interposed between the die 38 and the surface 37, is heated to melt the fusible material and subsequently cooled to bond the die 38 to the surface 37. This is done preferably, by placing the lead frame assembly 10 in an oven or furnace.

Figure 4:
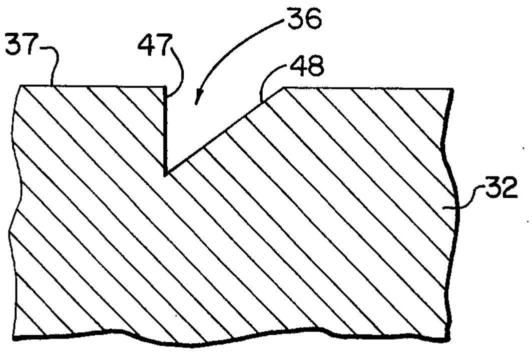
FIG. 4 is an enlarged view of a portion of the lead frame of FIG. 3, showing the construction of a grooved surface thereof.

As shown in FIG. 4, each groove 36 is preferably formed with a perpendicular wall 47 and an angled wall 48. The angle between the walls 47 and 48 may be, for example, 60°. The grooves 36 are preferably milled in the surface of the enlarged portion 32 of the tab 18, typically to a depth of 10 mils. In the absence of the grooves 36, during the bonding operation, the melted material might tend to flow across the surface of the support 32. Similarly, if the surface had a concentration of contaminates on a portion thereof the material might tend to migrate toward or away from the contaminated portion. This would cause the die 38 to become disoriented through translation, rotation or a combination thereof. In such a case the die 38 would require repositioning in order to bond the wires 41 properly thereto.

The configuration of the die-receiving surface 37 defined by the grooves 36 is governed by the particular planar geometry of the die 38, shown in FIG. 2 to be of a generally square or rectangular shape. Thus, four grooves are arranged to define a generally square configuration.

Figure 5:
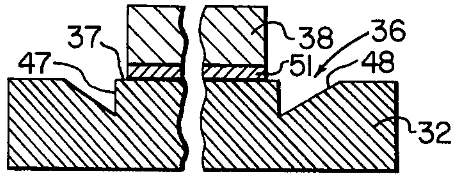
FIG. 5 is an enlarged fragmentary view of a portion of the lead frame of FIG. 3, illustrating a part supported on a planar surface thereof and having a layer of fusible material interposed between the part and the surface.
Figure 6:
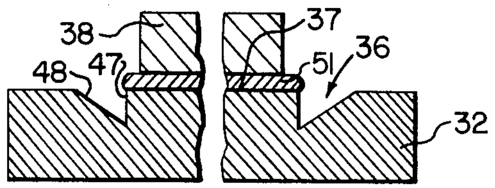
FIG. 6 is a view similar to FIG. 5 illustrating the manner in which the construction of the lead frame element confines the part to a portion of the surface of the element when the fusible material is in a molten state.

FIGS. 5 and 6 illustrate the manner in which the grooves 36 prevent the disorientation of the die 38 on the support 32 of the tab 18 during the bonding of the die 38 to the tab 18.

The die 38 is positioned on the die-receiving surface 37 of the support 32 with a layer of fusible material, for example, a suitable metal alloy solder 51 interposed therebetween. In FIG. 5 the material 51 is in solid form which is its state before the lead frame assembly 10 is heated.

Referring to FIG. 6, when the assembly 10 is heated, the material 51 melts and begins to flow. However, because of the sharpness of the intersection between the planar surface 37 and the perpendicular walls 47 of the grooves 36, the surface tension of the material 51 prevents it from flowing across the boundary defined by the walls 47 of the grooves 36. The grooves 36 may conveniently be referred to collectively as a moat around the die-receiving surface 37, confining the die 38 to the area of the surface 37 which is preferably of an identical configuration to the planar configuration of the die 38. It is not necessary to form the moat continuously around the die 38, since the surface tension of the material 51 will prevent it from flowing between the small spaces 52 (FIG. 2) between adjacent ones of the grooves 36.

Thus, the die 38 is prevented from moving substantially from the position on the surface 37 shown in FIG. 5 where it was first placed, facilitating the subsequent bonding of the wires 41 to the discrete electronic device carried by the die 38 using automated methods.

As mentioned above, the grooves 36 are preferably formed in the support 32 by a milling operation, which is relatively fast and inexpensive to perform. Alternatively, the grooves 36 may be formed in the support 37 by a stamping operation, for example, the same operation which stamps out the lead frame assembly 10.

Figure 7:
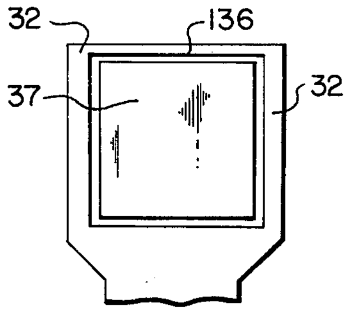
FIGS. 7 and 8 are plan views of two exemplary alternative embodiments of lead frame element in accordance with the principles of the invention.

As shown in the alternative embodiment of FIG. 7, a continuous groove 136 cross-sectionally identical to the grooves 36 of FIGS. 1–6, may be formed in the support 32 forming a boundary or moat around the die-receiving surface 37.

Figure 8:
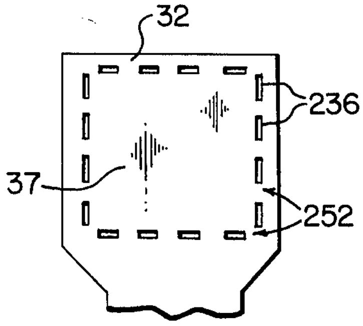

Further alternatively, as shown in FIG. 8, a plurality of discrete grooves 236 may be serially formed around the die-receiving surface 37 of the support 32. Again the surface tension of the fusible bonding material 51 will prevent its movement across the boundary defined by the grooves 236 through the spaces 252 therebetween. The grooves 236 may be cross-sectionally identical to the grooves 36.

While the grooves 36, 136 and 236 have been shown and described as having one wall perpendicular to the die-receiving surface and an angled opposite wall, other groove constructions may be utilized. The important requirement is that the inside wall 47, as best shown in FIGS. 4–6, contiguous with the die-receiving surface 37, intersects the surface 37 at an angle sufficient to prevent the molten fusible material 51 from flowing substantially beyond the boundary defined by the inside wall 47 of the groove 36 due to the surface tension of the fusible material. Thus, the inside wall 47 of the grooves 36 may be undercut or deviate from a plane perpendicular to the die-receiving surface 37 as long as the above requirement is met.

The wall 47 of the groove 36 defines a discontinuity in the surface of the support 32 and is the functional or operative part of the groove 36. It is therefore contemplated that a similar result could be obtained if the surface of the support 32 beyond the wall 47, were milled down flush with the deepest part of the groove 36 eliminating the wall 48. The die-receiving surface 37 would then become a platform or projection on the support 32. This is the inverse of the prior art cavity-forming technique and differs significantly therefrom primarily in that the mechanism preventing the fusible material 51 from flowing is the surface tension of the material 51, and not gravity. However, the formation of grooves is preferred since it is a relatively inexpensive technique to employ. The grooves 36 also function to retain any excess fusible material which may in some cases flow beyond the surface 37 in the event that so much thereof is used to bond the die 38 to the surface 37 that its surface tension is broken.

After the die 38 is bonded to the surface 37 of the support 32 on the tab 18 and the wires 41 are bonded to the contact pads 43 and 46 of the semiconductor device contained on the die 38 and the projections 28 and 31 of the legs 16 and 17, the device may be encapsulated in a suitable epoxy resin. Typically, during the encapsulation process, the segments 21 joining the legs 16 and 17 to the tab 18 are severed and the leads 12 are severed from the strip 13 as shown in FIG. 2. Electrical access to the encapsulated device may be obtained thereafter through the leads 12.

It is believed that the construction and operation of the above-described invention will be apparent from the foregoing description. While the methods of the invention have been described as being particularly suitable for the assembly of semiconductor devices, it will be obvious that the methods may be employed to facilitate the bonding of various parts to various articles and that various changes and modifications may be made therein without departing from the spirit and scope of the invention.

What is claimed is:

1. An improved lead frame of the type formed with a tab having a planar surface for mounting a semiconductor electronic device thereon and a pair of conductive coplanar legs spaced on opposite sides of the mounting surface of the tab, for supporting lead wires to be bonded thereto and to the device, wherein the improvement comprises:

wire-receiving angular sections formed in the legs and aligned with one another on opposite sides of the tab.

2. The improvement according to claim 1 and including means supporting the tab in offset relationship to the legs.

* * * * *